(12) United States Patent
Hiraoka et al.

(10) Patent No.: US 7,820,279 B2
(45) Date of Patent: Oct. 26, 2010

(54) RESIN SUBSTRATE HAVING A RESIN-METAL COMPOSITE LAYER AND METHOD FOR MANUFACTURING THEREOF

(75) Inventors: Motoki Hiraoka, Toyota (JP); Fumitaka Yoshinaga, Toyota (JP); Setsuto Daiza, Toyota (JP); Takeshi Bessho, Toyota (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 878 days.

(21) Appl. No.: 10/565,215

(22) PCT Filed: Jul. 22, 2004

(86) PCT No.: PCT/JP2004/010976

§ 371 (c)(1),
(2), (4) Date: Nov. 17, 2006

(87) PCT Pub. No.: WO2005/007929

PCT Pub. Date: Jan. 27, 2005

(65) Prior Publication Data

US 2007/0110973 A1    May 17, 2007

(30) Foreign Application Priority Data

Jul. 23, 2003    (JP) .............................. 2003-278538

(51) Int. Cl.
*B32B 27/32*    (2006.01)
*B32B 5/16*    (2006.01)
*B32B 15/04*    (2006.01)

(52) U.S. Cl. ...................... 428/220; 428/323; 428/332; 428/457

(58) Field of Classification Search ................... None
See application file for complete search history.

(56) References Cited

U.S. PATENT DOCUMENTS

| | | | |
|---|---|---|---|
| 5,318,803 A | | 6/1994 | Bickford et al. |
| 5,731,075 A | * | 3/1998 | Goto et al. ............... 428/323 |
| 5,803,131 A | | 9/1998 | Iwasa et al. |
| 2002/0018886 A1 | * | 2/2002 | Matsufuji et al. .......... 428/328 |

FOREIGN PATENT DOCUMENTS

| | | |
|---|---|---|
| EP | 0 485 699 | 5/1992 |
| EP | 1 380 671 | 1/2004 |
| JP | 1-92377 | 4/1989 |
| JP | 04-232278 | 8/1992 |
| JP | 05-303090 | 11/1993 |
| JP | 08-091063 | 4/1996 |
| JP | 08-092752 | 4/1996 |
| JP | 08-269723 | 10/1996 |
| JP | 09-087419 | 3/1997 |
| JP | 09-157417 | 6/1997 |
| JP | 2002-256442 | 9/2002 |
| JP | 2002-309377 | 10/2002 |
| JP | 2003-160876 | 6/2003 |
| JP | 2004-131807 | 4/2004 |
| WO | WO 02/088422 | 11/2002 |
| WO | WO 03/021005 | 3/2003 |
| WO | WO/2004/033754 | 4/2004 |

OTHER PUBLICATIONS

Anonymous: "Polyimide Surface Modification by Ozonlysia," Research Disclosure, Kenneth Mason Publications, Hampshire, GB, vol. 339, No. 37 (Jul. 1992).
Chinese Office Action dated Sep. 5, 2008.

* cited by examiner

*Primary Examiner*—Sheeba Ahmed
(74) *Attorney, Agent, or Firm*—Finnegan, Henderson, Farabow, Garrett & Dunner, LLP

(57) ABSTRACT

A resin-metal composite layer is formed by modifying a surface of a resin substrate to a modified layer, contacting the modified layer with a metal compound solution, and adsorbing at least either metal colloids or ions are adsorbed to the polar group, so that metal particles are dispersed into the modified layer. Because of the fineness of the metal particles in the resin-metal composite layer, high transparent can be achieved. The resin-metal composite layer functions as a transparent conductive layer and the like.

4 Claims, 2 Drawing Sheets

RESIN SUBSTRATE HAVING A RESIN-METAL COMPOSITE LAYER AND METHOD FOR MANUFACTURING THEREOF

FIELD OF THE INVENTION

The present invention relates to a resin substrate having a resin-metal composite layer and a method for manufacturing thereof. The resin substrate of the present invention has characteristics of conductivity, abrasion resistance, light resistance, flame resistance and the like, because of a resin-metal composite layer. Also, the resin-metal composite layer can be transparent and accordingly, it can be utilized in various fields such as liquid-crystal displays and printed circuit boards, etc.

DESCRIPTION OF THE RELATED ART

A resin material has become widely applied to the field metal or the like is conventionally used, because of its formability, highly flexible characteristics of strength, etc., and its light weight. A resin material, however, has disadvantages of nonconductivity, low hardness and the like. In order to solve these problems, a resin material is composed with other materials, such as metals.

For example, one method for giving electric conductivity to a resin material is to compose a powder of a conductive metal or a carbon fiber, etc. into a resin material. To achieve high conductivity, however, it is necessary to add large amounts of the conductive materials, which results in material deficiency and cost pushing. As the other method for giving electric conductivity to a resin material, it has been known to form a conductive coating such as metals or ITO. To form a conductive coating, physical means such as deposition and sputtering, and chemical means such as electroless plating have been known. However, physical means require a vacuum tank and the device tends to become large sized. Therefore, there are problems of restriction of space and productivity, which results in an increase in expense.

Moreover, there have been problems that when forming a metal coating on the surface of a resin material by electroless plating, the metal coating does not possess sufficient adhesion to the resin material and it readily peels off. Therefore, there have been generally carried out the processes of first chemically etching the resin material to roughen the surface thereof, and then electroless plating the chemically etched resin material. However, with the method of roughening the surface of the resin material by etching, the surface smoothness of the resin material decreases. In addition, hazardous substances such as chromic acid, sulfuric acid need to be used and it arises problems in the treatment of resultant liquid waste and the like.

Furthermore, Japanese unexamined patent publication No. 2002-309377 discloses another related art process for electroless plating. In accordance with this publication, the resin material is exposed to ozone solution, treated with a solution containing a surface active agent and an alkali component and followed by electroless plating. In this process, double bonds of the surface of the resin material are broken due to oxidation with ozone and a polar group is produced. Also, a brittle layer is removed by the alkali component and the surface active agent is adsorbed on the polar group. In pretreatment with a catalyst followed by electroless plating, the catalyst is adsorbed onto the surface active agent which is deposited on the polar group. Thus, in electroless plating, the metal easily bonds to the polar group, which results in improving the adhesion of the electroless plated coatings.

Further, WO 03/021005 discloses the process that a resin material is first soaked into a solution which contains a powder of an optical catalyst and exposed to the light in the solution to form a polar group on the surface of the resin material, thereafter electroless plating is carried out. This process also improves the adhesion strength of the electroless plated coatings. While, Japanese unexamined patent publication No. Hei 05-303090 discloses the method that first a photosensitive resist which contains hydrophilic resin is sprayed on a base material, exposed to light to form a relief and then treated by electroless plating to deposit metallic particles in the relief and to form a shading layer.

However, it is difficult to achieve translucency by the method of giving conductivity with electroless plated coatings, so it is difficult to adopt the resulting to liquid crystal displays and the like.

In addition, Japanese unexamined patent publication No. Hei 09-087419 discloses a conductive adjuster comprising a matrix which contains at least one compound formed through a polar group reaction in the matrix forming material having a polar group, and metallic particles deposited and dispersed into the matrix due to that reaction, which leads to disappear or decrease of interaction with the polar group. In accordance with this method, however, the conductive adjuster is formed by splaying a liquid substance to a substrate and thereafter heating and holding in vacuum space. The adhesion reliability of the conductive adjuster and the substrate is low. Also, it takes long time for reaction and accordingly, there is a problem of low productivity.

SUMMARY OF THE INVENTION

The present invention has been developed in view of such circumstances, and it is directed to providing a resin substrate having a resin-metal composite layer which has characteristics of conductivity, abrasion resistance and the like.

The present invention is also directed to readily and inexpensively produce a resin-metal composite layer.

To achieve the above objects, the resin substrate has a resin-metal composite layer that metallic particles are dispersed in a resin matrix at a surface of the resin substrate.

The resin substrate having a resin-metal composite layer comprises the resin substrate having the resin-metal composite layer, wherein the resin-metal composite layer is from 20 to 2000 nm in thickness.

The resin substrate having a resin-metal composite layer comprises the resin substrate having the resin-metal composite layer, wherein the resin-metal composite layer is a transparent conductive layer of 200 nm or less than 200 nm in thickness.

The method for manufacturing a resin substrate having a resin-metal composite layer at a surface thereof comprises a pretreatment process that a surface of the resin substrate is modified to a modified layer having a polar group, and an adsorbing process that at least either metal colloids or ions are adsorbed to the polar group by contacting the modified layer with a metal compound solution, whereby metal particles are dispersed into the modified layer.

The method for manufacturing a resin substrate having a resin-metal composite layer comprises the processes for manufacturing a resin substrate having a resin-metal composite layer, wherein after the adsorbing process, a metal coating is formed on the surface of the refining layer by electroless plating, thereafter removing the metal coating.

DETAILED DESCRIPTION OF THE PREFERRED EMBODIMENTS

Figure 1:
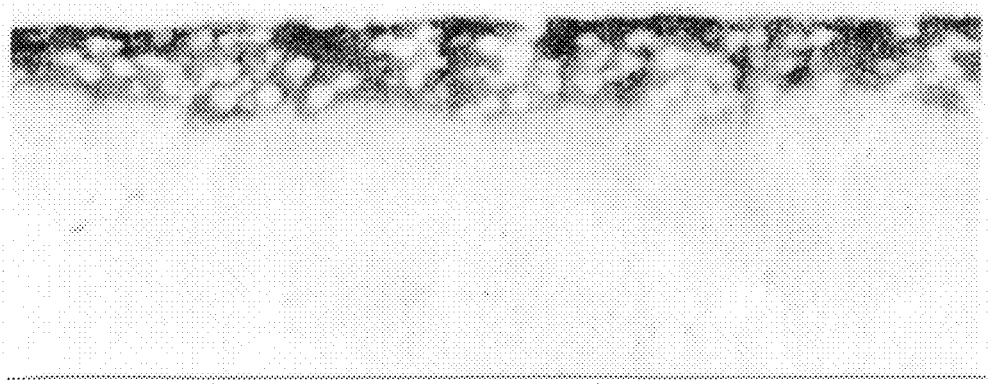
FIG. 1 is a TEM picture showing the cross-section of the resin substrate treated in example 1.

The resin substrate of claim 1 has a resin-metal composite layer that metallic particles are dispersed in a resin matrix at a surface of the resin substrate.

As the resin substrate, various sorts of thermoplastic resins or thermosetting resins such as ABS resin, AS resin, polystyrene resin, polyolefin resin, epoxy resin, AN resin, polyamide resin, polyester resin, PET resin, polyacetal resin, acrylic resin, polycarbonate resin, PMMA resin, cellulose type resin, fluorocarbon resin, POM resin, PBT resin, polyimide resin, modified PPO resin, polyphenylsulphide resin, silicone resin, polyurethane resin, phenol aldehyde resin, polymer alloy containing elastomer and PP, etc. can be used. In addition, shape of the resin substrate is not restricted and thus, the resin substrate can be formed from any shapes of moldings.

A resin-metal composite layer has fine metallic particles homogeneously dispersing in the resin matrix which composes the resin substrate. The metal can be selected from a group of precious metals such as Pd, Au, Ag, Pt, Rh and Ir or a group of base metals such as Cu, Al, Sn, Ni, Cr, Fe, Mo and Ti.

The concentration of metallic particles in the resin-metal composite layer varies according to the type of resins and metals or features objecting at. Generally it belongs from 20 to 90% in volume. When the concentration is less than 20 volume %, it is difficult to achieve the features of conductivity, abrasion resistance and the like. While when the concentration is more than 90% in volume, the characteristics of the resin tend to disappear.

Moreover, when a resin-metal composite layer is utilized as a clear conductive layer, for instance, transparent or semi-transparent resin substrates such as polycarbonate resin, PMMA resin and AS resin can be employed to form a resin-metal composite layer. In the resin matrix of the surface of the resin-metal composite layer, the particles of a conductive metal such as Au, Ag and Cu homogeneously disperse in the range of 20 to 70 volume %. When the concentration of the metallic particles is over 70% in volume, depending on the thickness of the resin-metal composite layer, translucency is decreased, so it is not preferable.

It is preferable that a resin-metal composite layer is formed in the range of 20 to 2000 nm in thickness. To ensure the translucency, it is preferable that the thickness is 200 nm or less than 200 nm. When the thickness is less than 20 nm, it is difficult to achieve the features of conductivity and abrasion resistance, and when it is over 2000 nm, the characteristics of the resin disappear. Further, for giving electric conductivity, depending on the concentration of metallic particles, it is preferable that it is over 50 nm in thickness.

In accordance with the method of the present invention for manufacturing and forming a resin-metal composite layer at a surface of a resin substrate, a pretreatment process is conducted first to modify a surface of a resin substrate to a modified layer having a polar group. As this pretreatment process, there are some methods such as (1) a method of contacting the surface of a resin substrate with high-concentration ozone solution, (2) a method of exposing ultraviolet ray to the surface of a resin substrate, (3) a method of exposing ultraviolet ray to the surface of a resin substrate which is in the state of contacting with high concentration ozone solution, (4) a method of performing (2) after conducting (1), (5) a method of radiating light to the surface of a resin substrate which is in the state that an optical catalyst is deposited, (6) a method of radiating light to the surface of a resin substrate which is contacted with an optical catalytic solution. The methods of (1), (3) or (4), which use high concentration ozone solution, is especially preferable.

The concentration of ozone in the ozone solution greatly affects the activation of the surface of the resin substrate. The activating effect can be observed from around 10 ppm. The activating effect drastically enhanced over 100 ppm and it enables to shorten treatment time. Also, higher ozone concentration is preferable, since deterioration proceeds with low concentration. Due to oxidation by ozone in the ozone solution, it is considered that ozonide is formed and polar groups such as C-OH bonds or C=O bonds are produced.

Ozone solution usually employs water as a solvent, however, it is preferable to use organic or inorganic polar solvent. This enables to further shorten the treatment time. As an organic polar solvent, it is possible to use, for instance, one selected from alcohol group such as methanol, ethanol and isopropyl alcohol; or N,N-dimethylformamide, N,N-dimethylacetamide, dimethyl sulfoxide, N-methylpyrolidone, hexamethylphospholamide; or organic acid group such as formic acid and acetic acid, solely or as a mixture with water and/or an alcohol-based solvent. Further, as an inorganic polar solvent, it is possible to use inorganic acid such as nitric acid, hydrochloric acid or hydrofluoric acid, etc.

It is preferable that radiated ultraviolet ray should be 310 nm or less than 310 nm in wavelength, preferably, less than 260 nm, more specifically around 150 to 200 nm. Also, it is desirable that quantity of ultraviolet radiation is more than 50 mJ/cm$^2$. As the light source to be able to radiate such ultraviolet ray, a low-pressure mercury lamp, a high-pressure mercury lamp, an eximer laser, a barrier discharge lamp, a microwave electrodeless discharge lamp, etc. can be used.

As a photocatalyst, it is possible to use one selected from, for instance, titanium dioxide, zinc oxide, cadmium sulfide, gallium phosphide, silicon carbide, indium oxide and vanadium oxide. When suspending a powder of a photocatalyst into water, it is preferable to suspend 0.05 g or more than 0.05 g of photocatalyst powder per 1 litter of water. When less than 0.05 g, it is difficult to achieve accelerated effect of activation of surface layer in radiating due to catalytic action of the photocatalyst.

In addition, when using a photocatalyst, it is preferable to use ultraviolet ray as light. By radiating ultraviolet ray, a photocatalyst can be rapidly activated, refining action can be achieved because of ultraviolet ray and thus, it is possible to shorten a treatment time.

For contacting a resin substrate with an ozone solution, there are some process, for instance, spraying an ozone solution to the surface of a resin substrate, or immersing a resin substrate into an ozone solution. The immersing of a resin substrate in an ozone solution is preferable, because ozone is difficult to be released from the ozone solution, as compared with the contact by spraying. When radiating ultraviolet ray, it is preferable to radiate the resin substrate which is immersed into ozone solution. This enables to suppress distortion and deterioration of the resin substrate due to the heat from ultraviolet source.

To radiate ultraviolet ray to the substrate which is immersed into an ozone solution, it is either to radiate as ultraviolet source is placed in the ozone solution or to radiate from above the surface of ozone solution. When the container of ozone solution is made of ultraviolet-ray transmitting materials such as transparent quarts, it is possible to radiate from outside the container of ozone solution.

Moreover, when radiating ultraviolet ray after the resin substrate contacted with ozone solution, it is preferable to radiate ultraviolet ray within such a short time as one minute from contacting with ozone solution. After passing this period, it becomes difficult to achieve multiplier action of ozone and ultraviolet ray, and a refining layer is not always formed with the treatment for such a short time.

When manufacturing electronic circuit boards for instance, to radiate ultraviolet ray on the surface of a resin substrate in a certain pattern, it is possible to employ the process of radiating ultraviolet ray in a pattern with a miniature projecting exposure apparatus, or the process of radiating ultraviolet ray with masking the surface using a photo mask, etc. In the latter process, it is necessary to mask as the part that a pattern is formed is exposed to ultraviolet ray and it is also necessary that the part contact ozone solution. Additionally, it is preferable that material of the mask does not penetrate ultraviolet ray and ozone. Metallic mask is one of such masks.

In the process of ozone solution-ultraviolet ray radiating treatment, as the treating temperature rises, the reaction rate increases in theory. However, as the treating temperature rises, the solubility of ozone in the ozone solution becomes low, and in order to increase the concentration of ozone in the ozone solution to 100 ppm or more at a temperature higher than 40° C., the treating atmosphere must be pressurized to be more than air pressure, and consequently the device becomes large. Accordingly, it is preferable that the treating temperature is adjusted to about room temperature where the device is not desired to become large.

In the process of ozone solution-ultraviolet ray radiating treatment, it is preferable that contacting duration of ozone solution and a resin substrate should be in the range of 4 to 20 minutes, although it depends on the type of resin. In less than 4 minutes, it is difficult to achieve the effect of ozone treatment even when ozone concentration is 100 ppm. While, over 20 minutes, deterioration of resin substrate begins to occur.

Further, in the process of ozone solution-ultraviolet ray radiating treatment, it is preferable that radiating duration of ultraviolet ray should be from about 4 to 15 minutes, depending on the type of resin of the resin substrate. In less than 4 minutes, it is difficult to achieve the effect of ultraviolet radiating. While over 15 minutes, deterioration of the resin substrate occurs due to the heat.

By the above mentioned pretreatment process, a refining layer having a polar group is formed on the surface of the resin substrate.

The thickness of this refining layer is determined by treatment duration or concentration of ozone in the ozone solution in pretreatment process. It is preferable that it should be from 20 to 2000 nm, which is the same thickness as the resin-metal composite layer.

In next adsorbing process, a modified layer is brought into contact with a metal compound solution and at least either metal colloids or ions are adsorbed to the polar group. Then, fine metallic particles are dispersed on the modified layer to form a resin-metal composite layer. As a metal compound solution, aqueous solution can generally be used. Further, as a metal compound solution, it is possible to use water-soluble inorganic acid salt, organic acid salt, complex or colloidal solution, etc. of the above mentioned precious metal or base metal.

To contact a modified layer with a metal compound solution, it is possible to spray the metal compound solution onto the surface of the resin substrate where the modified layer is formed. It is also possible to immerse the resin substrate into a metal compound solution. Because of this, metal compound solution diffuses and penetrates from the surface into the inner of the modified layer and metal compound ion or colloid is adsorbed to the polar group. Due to reduction, metal compound becomes fine metal particles of nano level and a resin-metal composite layer is formed.

It is further preferable, between pretreatment process and adsorbing process, to perform alkali extraction process contacting a refining layer with an alkali solution which contains at least one alkali component. The alkali component has the function of dissolving the surface of the modified layer to water on a molecular level and removing a blittle layer from the surface of the modified layer, whereby a larger amount of polar groups are deposited. Thus, it is possible to produce more fine metal particles in the adsorbing process. As this alkali component, it is possible to use sodium hydroxide, potassium hydroxide and lithium hydroxide, etc., which can dissolve the surface of modified layer down to the size of a molecule and remove the blittle layer.

It is preferable that the alkali solution further contains at least one of either an anion surface active agent or a nonionic surface active agent. This surface active agent is considered that the hydrophobic group is easily adsorbed to the polar group which exists in the refining layer, so it can be adsorbed to the most of the polar group. Thus, it is possible to produce more metal particles in the adsorbing process.

As this surface active agent, at least either anion surface active agent or nonionic surface active agent is used, which hydrophobic group can be readily adsorbed to at least one polar group of C=O and C—OH. As for a cationic surface active agent and neutral surface active agent, it is difficult to achieve the effect. As an anion surface active agent, sodium lauryl sulfate, potassium lauryl sulfate, sodium stearyl sulfate, potassium stearyl sulfate, etc. can be used. As a nonionic surface active agent, polyoxy ethylene dodecyl ether, etc. can be used. As a solvent of alkali solution which contains a surface active agent and an alkali component, it is preferable to use a polar solvent. Water is usually used as the polar solvent, however, an alcohol-based solvent or water-alcohol composite solvent can be used occasionally. To contact at least modified layer with alkali solution, it is possible to adapt the method of immersing a resin substrate into alkali solution or spraying alkali solution onto modified layer at least.

It is preferable that concentration of the surface active agent in the alkali solution is adjusted to range from 0.01 to 10 g/L. When the concentration of the surface active agent is less than 0.01 g/L, an amount of metal particles produced decreases. While when more than 10 g/L, the surface active agent associates each other in the modified layer and an excess surface active agent remains as impurities, whereby an amount of metal particles produced decreases. In this case, the resin substrate can be rinsed with water to remove the excess surface active agent.

Further, it is preferable that the concentration of the alkaline component in the alkali solution is adjusted such that the pH value thereof becomes 12 or more. Even when the pH value is less than 12, the effect can be achieved, but the amount of the polar group appearing is small, whereby it takes a long time to produce a predetermined amount of metal particles.

The contacting time of the alkali solution with the modified layer is not limited specifically, but 1 minute or more at room temperature is preferable. If the contacting time is too short, the amount of the surface active agent which is adsorbed on the polar groups may become too small. However, if the contacting time is too long, even the layer on which the polar group appears is dissolved. The contacting time of about 1 to 5 minutes is sufficient. It is preferable that the treating temperature is as high as possible, and as the temperature rises, the contacting time can be made shorter, but the temperature ranging from room temperature to around 60° is sufficient.

In alkali treatment process, after treated with a solution containing only the alkaline component, the surface active agent may be adsorbed, however, a brittle layer may occasionally be formed again until the surface active agent is adsorbed. Accordingly, it is preferable that the process is performed in the condition that at least one of either the anionic surface active agent or the nonionic surface active agent and the alkaline component coexist with each other.

Further, it is preferable to perform alkali treatment process after ozone solution treatment process. Under certain circumstances, it is possible to perform ozone solution treatment process and alkali treatment process simultaneously. In this case, a mixed solution of ozone solution and alkali solution is prepared, and a resin substrate is immersed in the prepared mixed solution. Or the composite solution is sprayed on the resin substrate. In this case, the reaction of ozone and the resin substrate is a rate-determining step, so that the treatment time is determined in accordance with the concentration of ozone in the mixed solution.

In addition, it is possible to perform the process of removing the alkaline component by rinsing with water after alkali treatment process. It has been clarified that the surface active agent is not removed by merely washing with water and the adsorbed state is maintained, since the surface active agent is strongly adsorbed on the polar groups. Thus, the effect does not disappear even after a considerable time has passed prior to adsorbing process.

After adsorbing process, it is possible to form a metal coating on a surface of the resin-metal composite layer by electroless plating, and thereafter remove the formed plated coating. In electroless plating treatment, the metal appears and grows using the metal particles formed in adsorbing process as a catalyst. The plated metal covers the surface of the metal particles in the resin-metal composite layer. Thus, the metal particles become relatively large particles having a two-layer structure. Also, the electroless plated coating is formed on the surface of the resin-metal composite layer.

Then, the resin-metal composite layer appears by removing the plated coatings. Among the resin-metal composite layer, the one with thick composite layer or with high concentration of metal particles can be suitably utilized as passive component self-contained boards, etc.

There is no restriction on the condition of electroless plating treatment or a type of metals to be deposited. The electroless plating can be performed in the same way as the conventional electroless plating. To remove the plated coatings, physical removing methods such as polishing, acid etching and reversing electrolytic method, etc. can be used. Additionally, it is necessary to determine the condition not to remove the resin-metal composite layer itself.

In accordance with the resin substrate having a resin-metal composite layer of the present invention, because of existence of the resin-metal composite layer, it is possible to give characteristics of conductivity, abrasion resistance, light resistance, flame resistance and the like. Also, the resin-metal composite layer can be made transparent or semi-transparent, so that it can be utilized in a various purpose, for example, liquid crystal displays and electronic circuit printed boards.

In accordance with the manufacturing method of the present invention, equipment such as a vacuum tank is not required and the resin-metal composite layer can be readily formed. It enables to manufacture with less process and time. Therefore, it is possible to manufacture resin products having the above mentioned excellent characteristics at low cost.

Embodiment

Hereinafter, the present invention will be explained concretely in accordance with some embodiments and comparative examples.

Embodiment 1

Pre-Treatment Process

An ABS resin plate was prepared and it was immersed in an ozone solution containing 150 ppm of ozone at room temperature for 4 minutes as a pre-treatment process. The surface of the plate was analyzed with FT-IR before and after the pre-treatment process. An absorbing peak was observed in the surface of the plate after pre-treatment process due to a carbonyl group (—C=O) and a hydroxyl group (—OH).

<Alkali Treatment Process>

Next, a composite aqueous solution which dissolves 50 g/L of NaOH (an alkali component) and 1 g/L of sodium lauryl sulfate (anion surface active agent) was heated to 60° C. The plate after pre-treatment process was immersed for 2 minutes.

<Adsorbing Process>

The plate after alkali treatment process was washed with water and dried. It was immersed for 3 minutes in the solution prepared by dissolving 0.1 weight % of palladium chloride and 5 weight % of tin chloride in an aqueous solution of 3N hydrochloric acid and heated to 50° C. Then, it was immersed for 3 minutes in an aqueous solution of 1N hydrochloric acid.

Figure 2:
FIG. 2 is a TEM picture showing the cross-section of the resin substrate treated in example 1.

TEM pictures of cross-section of the gained plate are shown in FIGS. 1 and 2 (partial enlargement of FIG. 1). It was observed that the metal particles (black dots) dispersed homogeneously in the range of 200 nm in depth from the surface of the plate. It was also observed that a resin-metal composite layer was formed in thickness of 200 nm. The concentration of metal was 60 volume % in the resin-metal composite layer.

Embodiment 2

The plate gained in Embodiment which has a resin-metal composite layer was immersed in a chemical plating bath of Ni—P, which was kept at 40° to deposit a Ni—P plated coating for 10 minutes. The thickness of the deposited Ni—P plated coating is 0.5 μm.

Then, the plate having plated coating was immersed in an alkali solution, applied 3 A/dn$^2$ of current density as the plated coating being anode and an electrode cathode and, dissolved and removed the plated coating by reverse electrolytic method.

Figure 3:
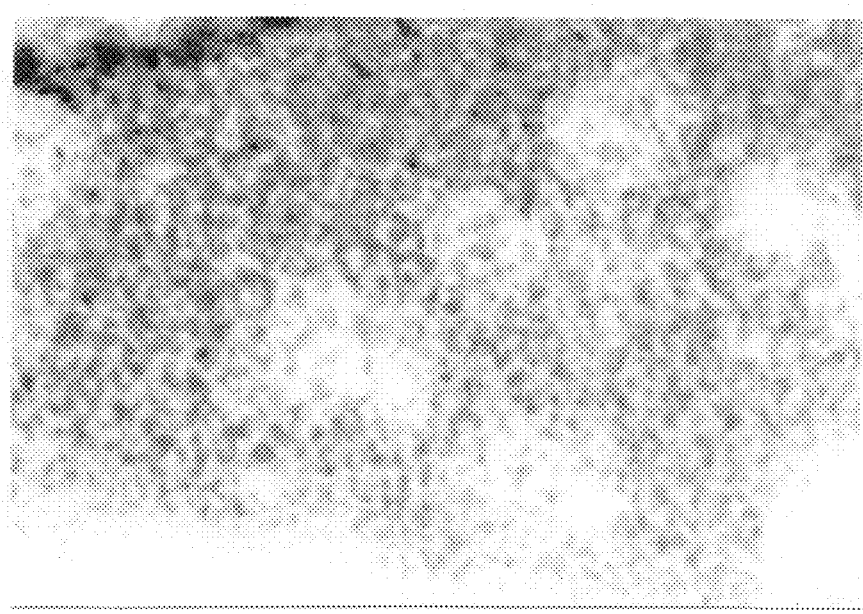
FIG. 3 is a TEM picture showing the cross-section of the resin substrate treated in example 2.

The TEM picture of the cross-section of the gained treated plate is shown in FIG. 3. It was observed that the metal particles dispersed homogeneously in the range of 100 nm in depth from the surface of the plate. It was also observed that the particle diameter of metal particles became larger in the resin-metal composite layer. The concentration of metal was 80 volume % in the resin-metal composite layer.

Comparative Example 1

The same plate as Embodiment 1 was used in Comparative example 1 except that the plate was untreated.
<Examination & Evaluation>
As to the plate treated in Embodiment 1, 2 and the plate of Comparative example 1, value of surface electrical resistance and surface Vickers hardness were measured. The result is shown in Table 1.

TABLE 1

|  | Thickness of Composite layer (nm) | Electrical Resistance ($\Omega$) | Surface Hardness |
|---|---|---|---|
| Embodiment 1 | 200 | $10^{-2}$ | 100 |
| Embodiment 2 | 100 | $10^{-4}$ | 250 |
| Comparative Example 1 | 0 | $10^{6}$ | 20 |

According to Table 1, the plates treated in Embodiment 1 and 2 have high surface conductivity and high value of surface hardness, so they have excellent abrasion resistance. This is obviously due to having a resin-metal composite layer.

Embodiment 3

Pre-Treatment Process

A plate made of polycarbonate resin was prepared and it was immersed in an ozone solution containing 150 ppm of ozone at room temperature for 6 minutes as a pre-treatment process. The surface of the plate was analyzed with FT-IR before and after the pre-treatment process. An absorbing peak was observed in the surface of the plate after the pre-treatment process due to a carbonyl group (—C═O) and a hydroxyl group (—OH).
<Alkali Treatment Process>
Next, a composite aqueous solution which dissolves 50 g/L of NaOH (an alkali component) and 1 g/L of sodium lauryl sulfate (anion surface active agent) was heated to 60° C. The plate after pre-treatment process was immersed for 2 minutes.
<Adsorbing Process>
As soon as completing alkali treatment process, the plate was immersed for 3 minutes in the solution prepared by dissolving 0.1 weight % of silver chloride and 5 weight % of tin chloride in an aqueous solution of 3N hydrochloric acid and heated to 50° C. Then, it was immersed for 3 minutes in an aqueous solution of 1N hydrochloric acid.

As a result of TEM observation of cross-section of the gained plate, it was observed that the metal particles dispersed homogeneously in the range of 100 nm in depth from the surface of the plate. It was also observed that a resin-metal composite layer was formed in thickness of 100 nm. The concentration of metal was 70 volume % in the resin-metal composite layer.

Embodiment 4

A plate was treated in the same way as Embodiment 3 except for the treatment time of pre-treatment process and adsorbing process being 12 minutes and 6 minutes, respectively. The formed resin-metal composite layer is 200 nm in thickness. The concentration of metal was 70 volume % in the resin-metal composite layer.

Embodiment 5

A plate was treated in the same way as Embodiment 3 except for the treatment time of pre-treatment process and adsorbing process being 3 minutes and 1.5 minutes, respectively. The formed resin-metal composite layer is 50 nm in thickness. The concentration of metal was 70 volume % in the resin-metal composite layer.

Comparative Example 2

The same plate as Embodiment 3 was used in Comparative example 2 except that the plate was untreated.
<Examination & Evaluation>
As to the plate treated in Embodiment 3 to 5 and the plate of Comparative example 2, transmittance of visible radiation and value of surface electrical resistance were measured. The result is shown in Table 2.

TABLE 2

|  | Thickness of Composite layer (nm) | Transmittance (%) | Electrical Resistance ($\Omega$) |
|---|---|---|---|
| Embodiment 3 | 100 | 90 | $10^{-2}$ |
| Embodiment 4 | 200 | 50 | $10^{-4}$ |
| Embodiment 5 | 50 | 100 | 10 |
| Comparative Example 2 | — | 100 | $10^{6}$ |

According to Table 2, it is observed that the plates treated in Embodiment 3 to 5 all suppress transmitting of ultraviolet ray. It is obvious that prevention of ultraviolet ray transmitting appeared due to the resin-metal composite layer. Further, the plate treated in Embodiment 3 has approximately the same degree of transparency as Comparative example 2, as well as having high conductivity. While, the plate treated in Embodiment 4 has less transparency, although it has high conductivity. The plate treated in Embodiment 5 has less conductivity, although it has the same degree of transparency as Comparative example 2. Therefore, it is desirable that a resin-metal composite layer should be 50 to 200 nm in thickness when a resin-metal composite layer functioning as a transparent conductive layer.

The invention claimed is:

1. A resin substrate, comprising:
   a resin-metal composite layer defining a top surface of the resin substrate,
   the resin-metal composite layer comprising reduced metallic particles dispersed in a resin matrix and adsorbed to polar groups in the resin matrix,
   wherein the resin-metal composite layer is from 20 to 200 nm in thickness; and the concentration of the metallic particles is from 20 to 90% (v/v) in the resin-metal composite layer.

2. The resin substrate having a resin-metal composite layer set forth in claim 1, wherein said resin-metal composite layer is a transparent conductive layer which is 200 nm or less in thickness.

3. The resin substrate having a resin metal composite layer set forth in claim 1, wherein the metallic particles comprise metal particles selected from a group of precious metals.

4. The resin substrate set forth in claim 1, wherein the resin-metal composite layer is from 50 to 200 nm in thickness; and the concentration of the metallic particles is from 60 to 80% (v/v) in the resin-metal composite layer.

* * * * *

UNITED STATES PATENT AND TRADEMARK OFFICE
CERTIFICATE OF CORRECTION

| | | |
|---|---|---|
| PATENT NO. | : 7,820,279 B2 | Page 1 of 1 |
| APPLICATION NO. | : 10/565215 | |
| DATED | : October 26, 2010 | |
| INVENTOR(S) | : Hiraoka et al. | |

It is certified that error appears in the above-identified patent and that said Letters Patent is hereby corrected as shown below:

Col. 10, line 57, after "substrate" delete "having a resin metal composite layer".

Signed and Sealed this
Nineteenth Day of April, 2011

David J. Kappos
*Director of the United States Patent and Trademark Office*